United States Patent [19]
Proebsting

[11] Patent Number: 5,995,437
[45] Date of Patent: Nov. 30, 1999

[54] SEMICONDUCTOR MEMORY AND METHOD OF ACCESSING MEMORY ARRAYS

[75] Inventor: Robert J. Proebsting, Los Altos Hills, Calif.

[73] Assignee: Townsend and Townsend and Crew LLP, San Francisco, Calif.

[21] Appl. No.: 09/083,334

[22] Filed: May 21, 1998

Related U.S. Application Data

[60] Provisional application No. 60/047,370, Jun. 2, 1997.
[51] Int. Cl.$^6$ ..................................................... G11C 8/00
[52] U.S. Cl. ........................................ 365/230.03; 365/63
[58] Field of Search ......................... 365/230.03, 189.01, 365/63

[56] References Cited

U.S. PATENT DOCUMENTS 4,748,552  5/1998  Fung et al. ........................ 365/230.03
5,586,078  12/1996 Takase et al. ...................... 365/230.03
5,812,481  9/1998  Numata et al. ..................... 365/230.03

Primary Examiner—Son T. Dinh
Attorney, Agent, or Firm—Townsend and Townsend and Crew LLP; Henry K. Woodward

[57] ABSTRACT

Accessing of adjacent arrays of memory in a semiconductor integrated circuit is facilitated by numbering the arrays of memory in accordance with a digital Gray code in which the addresses of adjacent arrays differ in only one digit. Each array is selected by the full array select address field. Each sense amplifier and I/O circuitry between memory arrays and shared by two adjacent memory arrays is selected by the full array select address field less one bit, that bit being the single address bit that differs between the addresses of the two adjacent Grey code numbered memory arrays. This permits faster decoding and enabling of the sense amplifier and I/O signal circuitry.

3 Claims, 3 Drawing Sheets

| | | | | | | |
|---|---|---|---|---|---|---|
| | | | I/O 4 | $\overline{A2}$ | $\overline{A1}$ | $\overline{A0}$ |
| $\overline{A2}$ | $\overline{A1}$ | $\overline{A0}$ | 000 | | | |
| | | | I/O 6 | | | |
| | | | I/O 0 | $\overline{A2}$ | | $\overline{A0}$ |
| $\overline{A2}$ | A1 | $\overline{A0}$ | 010 | | | |
| | | | I/O 2 | | | |
| | | | I/O 1 | $\overline{A2}$ | A1 | |
| $\overline{A2}$ | A1 | A0 | 011 | | | |
| | | | I/O 3 | | | |
| | | | I/O 0 | $\overline{A2}$ | | A0 |
| $\overline{A2}$ | $\overline{A1}$ | A0 | 001 | | | |
| | | | I/O 2 | | | |
| | | | I/O 1 | | $\overline{A1}$ | A0 |
| A2 | $\overline{A1}$ | A0 | 101 | | | |
| | | | I/O 3 | | | |
| | | | I/O 0 | A2 | | A0 |
| A2 | A1 | A0 | 111 | | | |
| | | | I/O 2 | | | |
| | | | I/O 1 | A2 | A1 | |
| A2 | A1 | $\overline{A0}$ | 110 | | | |
| | | | I/O 3 | | | |
| | | | I/O 0 | A2 | | $\overline{A0}$ |
| A2 | $\overline{A1}$ | $\overline{A0}$ | 100 | | | |
| | | | I/O 2 | | | |
| | | | I/O 1 | | $\overline{A1}$ | $\overline{A0}$ |
| $\overline{A2}$ | $\overline{A1}$ | $\overline{A0}$ | 000 | | | |
| | | | I/O 3 | | | |
| | | | I/O 5 | $\overline{A2}$ | | $\overline{A0}$ |
| $\overline{A2}$ | A1 | $\overline{A0}$ | 010 | | | |
| | | | I/O 7 | | | |
| | | | I/O 4 | $\overline{A2}$ | A1 | |
| $\overline{A2}$ | A1 | A0 | 011 | | | |
| | | | I/O 6 | | | |
| | | | I/O 5 | $\overline{A2}$ | | A0 |
| $\overline{A2}$ | $\overline{A1}$ | A0 | 001 | | | |
| | | | I/O 7 | | | |
| | | | I/O 4 | | $\overline{A1}$ | A0 |
| A2 | $\overline{A1}$ | A0 | 101 | | | |
| | | | I/O 6 | | | |
| | | | I/O 5 | A2 | | A0 |
| A2 | A1 | A0 | 111 | | | |
| | | | I/O 7 | | | |
| | | | I/O 4 | A2 | A1 | |
| A2 | A1 | $\overline{A0}$ | 110 | | | |
| | | | I/O 6 | | | |
| | | | I/O 5 | A2 | | $\overline{A0}$ |
| A2 | $\overline{A1}$ | $\overline{A0}$ | 100 | | | |
| | | | I/O 7 | | | |
| | | | I/O 4 | A2 | $\overline{A1}$ | $\overline{A0}$ |
| | | | I/O 6 | | | |

*FIG. 3*

SEMICONDUCTOR MEMORY AND METHOD OF ACCESSING MEMORY ARRAYS

This is a continuation of Provisional Application, Ser. No. 60/047,370 filed on Jun. 2, 1997.

BACKGROUND OF THE INVENTION

This invention relates generally to semiconductor memories such as static and dynamic random access memories, and more particularly the invention relates to the numbering sequence of memory arrays for faster selection of the shared sense amplifier regions between memory arrays.

Data is stored in semiconductor memories in addressable word lines with each word line having a plurality of data bits. The capacity of semiconductor memory integrated circuits has reached multi-mega bit levels, and the memory is organized as a plurality of addressable arrays for accessing stored data and writing data. As shown in FIG. 1, the memory arrays 10-1, 10-3, 10-5, 10-7 have sense amplifiers and input/output (I/O) circuitry 12-0, 12-2, 12-4, 12-6, 12-8 positioned above and below each array and shared by adjacent arrays. Each sense amplifier and I/O circuit is selected if and only if the memory array directly above or below the sense amplifier is selected. The activation of each block of sense amplifiers and I/O circuitry 12 requires the OR gating of the adjacent array select activation signals. The array select activation signals in FIG. 1, i.e. the outputs of inverters 15-1, 15-3, 15-5, 15-7, are ORed together in adjacent pairs to generate the sense amplifier and I/O activation signals i.e. the outputs of inverters 18-2, 18-4, 18-6. With this prior art implementation, the sense amplifier select signal occurs later than do the array select activation signals, that is, later than desirable. The binary coded numbering of arrays in accordance with the prior art does not allow for a direct AND gating of array select address signals to generate the sense amplifier activation signal because a plurality of bits might change between the two numbers. For example, array 1 (binary 001) and array 2 (binary 010) have both of the two least significant bits change between the two binary numbers. Thus, the decoding logic for controlling the shared block of sense amplifiers and I/O circuitry 12-4 requires two AND functions, NAND gates 14-3 and 14-5 followed by inverters which then feed a two input OR function, NOR gate 16-4 and inverter 18-4 to select and enable the block 12-4. Increased delay is encountered in the decoding operation.

The present invention is directed to an improved method of choosing the address decode sequence of memory arrays to allow for faster decoding of the shared sense amplifier and I/O regions between the memory arrays.

SUMMARY OF THE INVENTION

In accordance with the present invention, memory arrays in a semiconductor integrated circuit are numbered according to a digital Gray code wherein the digital address of adjacent arrays differ only in a single bit. Accordingly, the OR logic circuitry responsive to digital numbers of adjacent arrays as necessary in driving the shared block of sense amplifiers and I/O circuitry of the prior art is replaced by an AND function of the address bus (less one bit) and less delay is encountered in the decoding logic.

In a preferred embodiment, the OR function responsive to digital numbers of adjacent memory arrays requires only an N-1 input AND function of the N bit array select address but to directly activate the shared block of sense amplifiers and I/O circuitry.

The invention and objects and features thereof will more readily apparent from the following detailed description and appended claims when taken with the drawings.

BRIEF DESCRIPTION OF THE DRAWINGS

FIG. 3 is a functional block diagram of a larger array of memory with select addresses in accordance with the invention.

DETAILED DESCRIPTION OF THE ILLUSTRATIVE EMBODIMENTS

Figure 1:
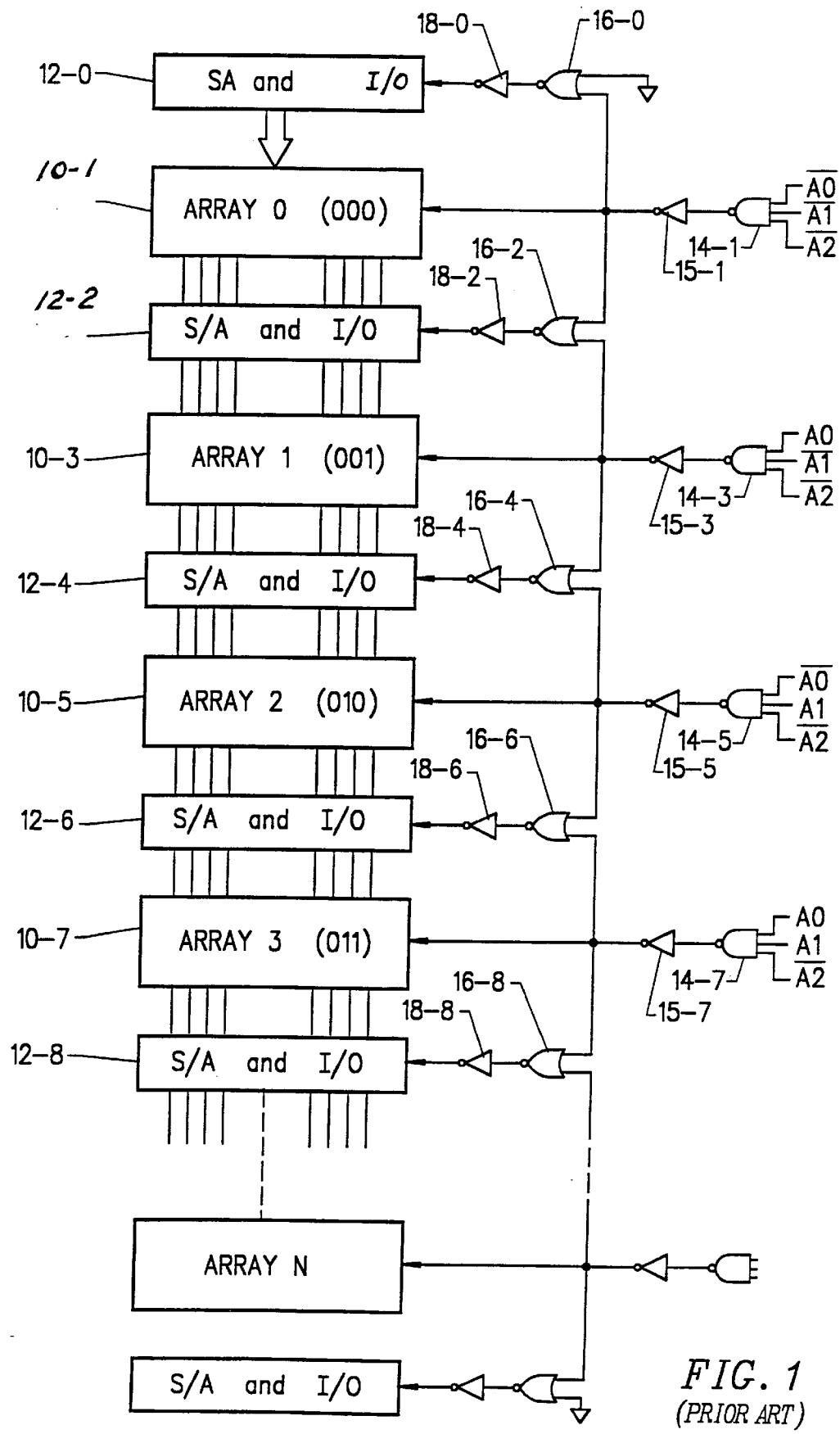
FIG. 1 is a functional block diagram of a memory array in accordance with the prior art.
Figure 2:
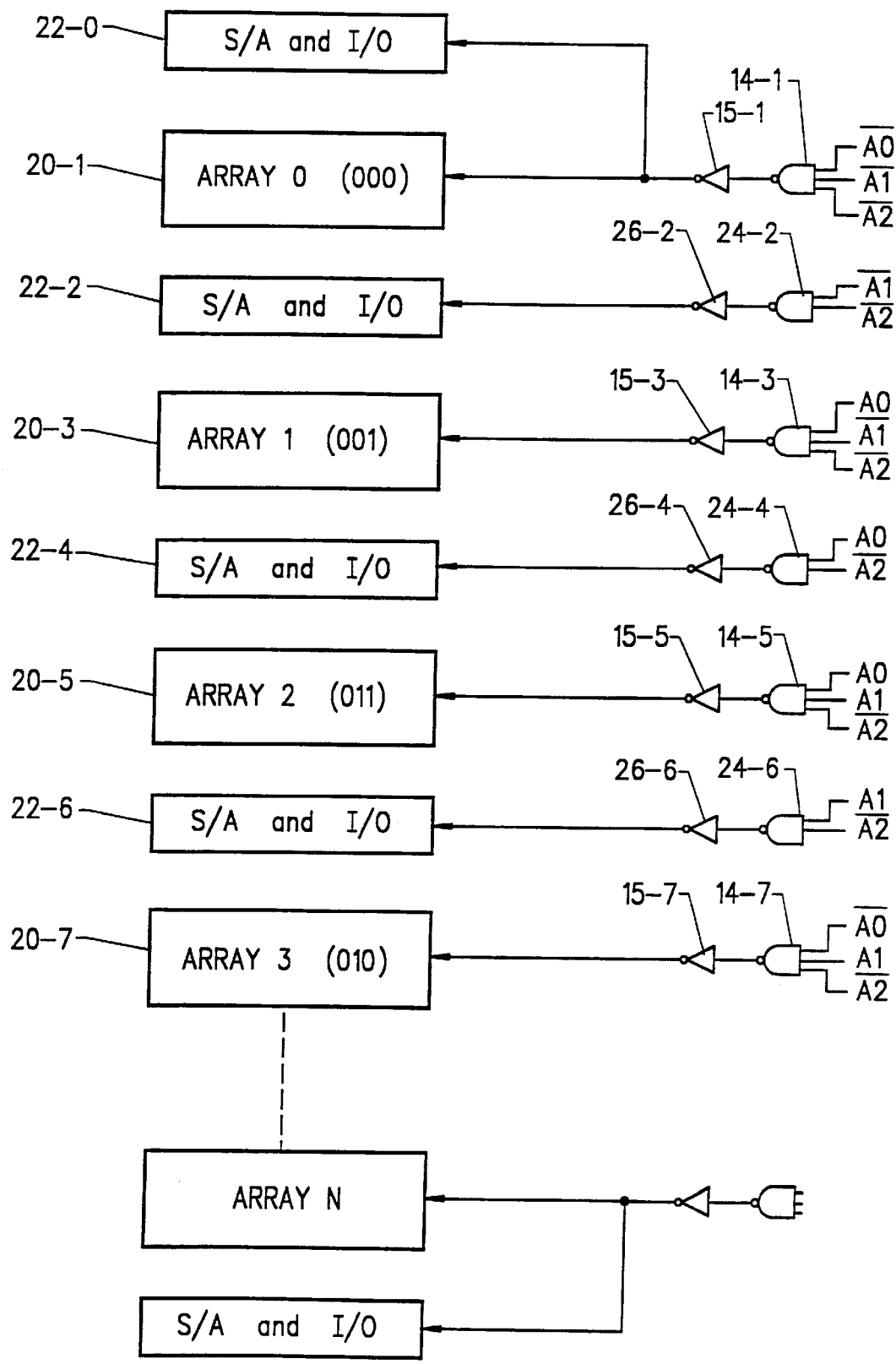
FIG. 2 is a functional block diagram of a memory array in accordance with one embodiment of the invention.

FIG. 2 is a functional block diagram of a memory array in accordance with one embodiment of the invention. A plurality of memory arrays 20-1, 20-3, 20-5, 20-7, etc. have blocks of sense amplifiers and I/O circuitry 22-0, 22-2, 22-4, 22-6, etc. positioned above and below each memory array. In accordance with the invention, each array has an address in a digital sequence whereby the digital code for adjacent arrays differ only in one digit. A well known example of such a sequence is a Gray code sequence. For example, array 0 and array 1 differ only in the least significant bit, array 1 and array 2 differ only in the second least significant bit, and array 2 and array 3 differ only in the least significant bit. Accordingly, the OR logic function required in activating a block of sense amplifiers and I/O circuitry between memory arrays requires only a 2 input AND function of 2 bits of the address bus. Thus, the OR function for two selected adjacent arrays consists of a 2 input NAND gate 24 followed by an inverter 26 and responds directly to the address bus to activate the selected block of sense amplifiers and I/O circuitry 22. The logic circuitry of FIG. 2 has fewer logic delays to generate the sense amplifier and I/O select circuitry when compared to the logic circuitry of the prior art (FIG. 1). The delay in responding to the selected addresses is reduced.

FIG. 3 illustrates a bank of 16 memory arrays two of which are selected together to serve 8 I/O lines 0 through 7. A three-digit code is used to identify and select each array. Adjacent arrays differ in only one digit in the three array select addresses. The block of sense amplifiers and I/O lines between adjacent arrays are identified by the OR function of the two adjacent binary Gray code addresses, but implemented by an AND function of a selected 2 array select address bits.

The top memory array (and the sense amplifier and I/O directly above it) are selected by an AND function of $\overline{A2}$, $\overline{A1}$, and $\overline{A0}$. The next array down is selected by an AND function of $\overline{A2}$, $\overline{A1}$ and $\overline{A0}$. The sense amplifier and I/O between them is selected by an AND function of $\overline{A2}$ and $\overline{A0}$. This AND function does not use the single bit, A1, that differs in the selection address of the memory arrays above and below this sense amplifier and I/O circuitry.

While the invention has been described with reference with specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A semiconductor memory integrated circuit comprising:

an array of memory cell arrays, said array having digital addresses in a sequence in which addresses of adjacent arrays differ in only one digit, a plurality of blocks of sense amplifiers and input/output circuitry disposed between and shared by two adjacent arrays of memory cells, and logic circuitry for the selection of each shared sense amplifier and I/O circuitry responsive to common bits of two array select addresses for adjacent arrays wherein each logic circuit responds to all address bits except one of the array select address for the two adjacent arrays.

2. The semiconductor memory integrated circuit as defined by claim 1 wherein said logic circuitry comprises an AND function of all bits of the array select address except for the single bit that differs in the address selecting the memory arrays on each side of the sense amplifier and input/output circuitry.

3. A method of accessing arrays of memory in a semiconductor memory integrated circuit comprising the steps of:

a) assigning digital addresses to the arrays of memory in accordance with a data sequence in which addresses of adjacent arrays differ in only one digit, b) providing a shared block of sense amplifiers and input/output circuitry between adjacent arrays of memory, and c) activating a shared block of sense amplifiers and input/output circuitry with a decoder that is an AND function of all bits of the array select address for each adjacent memory array except for the one digit that differs in the address of the two adjacent memory arrays.

* * * * *